(12) United States Patent
Sakai et al.

(10) Patent No.: US 12,278,092 B2
(45) Date of Patent: Apr. 15, 2025

(54) PLASMA TREATMENT DEVICE

(71) Applicant: NISSIN ELECTRIC CO., LTD., Kyoto (JP)

(72) Inventors: Toshihiko Sakai, Kyoto (JP); Daisuke Azuma, Kyoto (JP); Seiji Nakata, Kyoto (JP); Yasunori Ando, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 606 days.

(21) Appl. No.: 17/260,233

(22) PCT Filed: Jul. 17, 2019

(86) PCT No.: PCT/JP2019/028023
§ 371 (c)(1),
(2) Date: Jan. 14, 2021

(87) PCT Pub. No.: WO2020/017531
PCT Pub. Date: Jan. 23, 2020

(65) Prior Publication Data
US 2021/0272777 A1   Sep. 2, 2021

(30) Foreign Application Priority Data
Jul. 19, 2018 (JP) .................... 2018-136215

(51) Int. Cl.
*H01J 37/32* (2006.01)
*C23C 16/509* (2006.01)
*C23C 16/52* (2006.01)

(52) U.S. Cl.
CPC ...... *H01J 37/32449* (2013.01); *C23C 16/509* (2013.01); *C23C 16/52* (2013.01); *H01J 37/3211* (2013.01); *H01J 2237/3321* (2013.01); *H01J 2237/3323* (2013.01)

(58) Field of Classification Search
USPC ................................................. 156/345.34
See application file for complete search history.

(56) References Cited

U.S. PATENT DOCUMENTS 5,819,434 A * 10/1998 Herchen ............. H01J 37/3244
34/235
6,159,297 A * 12/2000 Herchen ........... C23C 16/45565
118/712

(Continued)

FOREIGN PATENT DOCUMENTS

CN    105491780    4/2016
CN    107251657    10/2017

(Continued)

OTHER PUBLICATIONS

"Office Action of Korea Counterpart Application", issued on Feb. 8, 2022, with English translation thereof, p. 1-p. 8.

(Continued)

*Primary Examiner* — Ram N Kackar
(74) *Attorney, Agent, or Firm* — JCIPRNET

(57) ABSTRACT

The present invention realizes a plasma treatment device with which a film deposition rate and film thickness of a film formed on a substrate can be made uniform. A plasma treatment device includes: a plurality of antennas for plasma generation arranged in a vacuum chamber; and a plurality of groups of multiple gas injection ports arranged in the vicinity of lines that are substantially perpendicular to longitudinal directions of the plurality of antennas and extend in a direction in which the plurality of antennas are arranged with respect to each other. The plasma treatment device further includes a gas flow-rate control unit for controlling flow rates of gas injected from each of the groups of the multiple gas injection ports.

3 Claims, 11 Drawing Sheets

(56) References Cited

U.S. PATENT DOCUMENTS

| | | | |
|---|---|---|---|
| 2005/0199186 A1 | 9/2005 | Yeom et al. | |
| 2005/0251990 A1* | 11/2005 | Choi | C23C 16/455 29/458 |
| 2010/0236917 A1* | 9/2010 | Mori | H01J 37/32082 422/186.04 |
| 2011/0308734 A1* | 12/2011 | Guittienne | H01J 37/3222 156/345.33 |
| 2014/0071581 A1* | 3/2014 | Haas | H01L 21/6831 361/234 |
| 2015/0099058 A1* | 4/2015 | Takizawa | C23C 16/4554 427/8 |
| 2016/0056021 A1 | 2/2016 | Tsujimoto et al. | |
| 2016/0099130 A1* | 4/2016 | Ando | H01J 37/32522 315/111.21 |

FOREIGN PATENT DOCUMENTS

| | | | | |
|---|---|---|---|---|
| CN | 108122726 | | 6/2018 | |
| JP | 05-136098 | * | 6/1993 | H01L 21/302 |
| JP | H1070107 | | 3/1998 | |
| JP | 2007273773 | | 10/2007 | |
| JP | 2007273818 | | 10/2007 | |
| JP | 2008053650 | | 3/2008 | |
| JP | 2009238898 | | 10/2009 | |
| JP | 2016149287 | | 8/2016 | |
| JP | 2017010820 | | 1/2017 | |
| TW | 200948218 | | 11/2009 | |

OTHER PUBLICATIONS

Office Action of China Counterpart Application, with English translation thereof, issued on Sep. 30, 2022, pp. 1-20.
Office Action of China Counterpart Application, with English translation thereof, issued on Apr. 11, 2023, pp. 1-19.
"Decision of Refusal of China Counterpart Application", issued on Jul. 20, 2023, with English translation thereof, p. 1-p. 21.
"International Search Report (Form PCT/ISA/210) of PCT/JP2019/028023," mailed on Oct. 8, 2019, with English translation thereof, pp. 1-4.

* cited by examiner (a)

(b)

(a)

(b)

PLASMA TREATMENT DEVICE

CROSS-REFERENCE TO RELATED APPLICATION

This application is a 371 application of an international PCT application serial no. PCT/JP2019/028023, filed on Jul. 17, 2019, which claims the priority benefit of Japan application JP2018-136215, filed on Jul. 19, 2018. The entirety of the above-mentioned patent application is hereby incorporated by reference herein and made a part of this specification.

BACKGROUND

Technical Field

The present invention relates to a plasma treatment device.

Related Art

A plasma treatment device that performs film deposition or etching by generating inductively coupled plasma is known as a conventional technology. This plasma treatment device may be, for example, a plasma treatment device disclosed in patent literature 1.

The plasma treatment device disclosed in patent literature 1 includes a high frequency antenna arranged in a vacuum chamber that is evacuated to a vacuum and into which gas is introduced. In the plasma treatment device, gas is introduced via a plurality of gas introduction ports arranged in a direction along the high frequency antenna. The above plasma treatment device performs a treatment to a substrate accommodated in the vacuum chamber.

LITERATURE OF RELATED ART

Patent Literature

Patent literature 1: Japanese Patent Laid-Open No. 2016-149287 (published on Aug. 18, 2016)

SUMMARY

Problems to be Solved

However, in the plasma treatment device disclosed in patent literature 1, because the gas introduction port is only arranged in the direction along the high frequency antenna, there is a problem as follows. Specifically, there is a problem that a difference is generated in the magnitude of a current flowing through each location of the high frequency antenna in a longitudinal direction in the plasma treatment device, and thus a film deposition rate or film thickness of a film formed on the substrate accommodated in the vacuum chamber becomes non-uniform.

One aspect of the present invention is to realize a plasma treatment device with which a film deposition rate and film thickness of a film formed on a substrate can be made uniform.

Means to Solve Problems

In order to solve the above-described problem, a plasma treatment device according to one aspect of the present invention includes: a plurality of antennas for plasma generation arranged in a manner of facing a substrate in a vacuum chamber in which the substrate is accommodated; a plurality of groups of multiple gas injection ports arranged in the vicinity of lines that are substantially perpendicular to longitudinal directions of the plurality of antennas and extend in a direction in which the plurality of antennas are arranged with respect to each other; and the plasma treatment device further includes a gas flow-rate control unit for controlling flow rates of gas injected from each of the groups of the multiple gas injection ports.

According to the above configuration, even if there is a difference in the magnitude of the current flowing through each location in the longitudinal direction of the antenna, the following effects can be obtained by performing the following treatment. Specifically, in order that plasma generated at each location of the substrate becomes uniform, the flow rate of gas injected from each gas injection port is controlled, and thereby the film deposition rate and the film thickness of a film formed on the substrate can be made uniform.

The gas injection port arranged in the vicinity of a corner part of the vacuum chamber may be arranged in a manner that the flow rate of gas injected from the gas injection port arranged in the vicinity of the corner part is larger than the flow rate of gas injected from the gas injection ports arranged at a location other than the vicinity of the corner part.

According to the above configuration, the flow rate of gas can be increased in the vicinity of the corner part of the vacuum chamber where the flow rate of gas easily tends to be smaller than that of other locations. Thereby, plasma generated at each location of the substrate can be made more uniform, and the film deposition rate and the film thickness of a film formed on the substrate can be made more uniform.

The plurality of antennas may include an antenna having a structure in which a conductor unit through which a current flows and a capacitance element for accumulating electric charges are alternately connected in series, and the multiple gas injection ports may include a gas injection port arranged in the vicinity of the conductor unit and a gas injection port arranged in the vicinity of the capacitance element.

According to the above configuration, because the gas injection port is arranged in accordance with a regular structure of the antenna, when the flow rate of gas injected from each gas injection port is controlled, plasma generated at each location of the substrate can be more easily made uniform. Further, even when there is a difference in plasma generation in the vicinity of the conductor unit and the vicinity of the capacitance element, plasma can be made uniform.

The multiple gas injection ports may be arranged between the plurality of antennas when viewed from a normal line direction with respect to a plane on which the plurality of antennas are arranged.

According to the above configuration, for example, by controlling the flow rate of gas injected from each gas injection port, the flow rate of gas injected between the plurality of antennas can be made uniform.

In the vacuum chamber, a plasma generation suppressing member may be arranged between the antenna and a wall of the vacuum chamber opposite to the substrate with respect to the antenna.

According to the above configuration, it is possible to suppress the generation of plasma between the antenna and the wall of the vacuum chamber. Therefore, it is possible to suppress the flow-out of a current flowing through the antenna from the antenna to the wall of the vacuum chamber via a space between the antenna and the wall of the vacuum chamber.

Thereby, because the magnitude of the current flowing through each location in the longitudinal direction of the antenna can be made uniform, plasma generated at each location of the substrate can be made more uniform, and the film deposition rate and the film thickness of a film formed on the substrate can also be made more uniform.

[Effect]

According to one aspect of the present invention, it is possible to realize a plasma treatment device with which a film deposition rate and film thickness of a film formed on a substrate can be made uniform.

BRIEF DESCRIPTION OF THE DRAWINGS (a) of FIG. 1 is a bottom view showing the configuration of a plasma treatment device of Embodiment 1 of the present invention, and (b) of FIG. 1 is a diagram showing the arrangement relationship between an antenna 20 and a gas injection port 30.

(a) of FIG. 2 is a cross-section view showing the configuration of a cross-section of the plasma treatment device at a line L1 shown in (a) of FIG. 1, and (b) of FIG. 2 is a cross-section view showing the configuration of a cross-section of the plasma treatment device at a line of a longitudinal direction D1 shown in (a) of FIG. 1.

Figure 7:
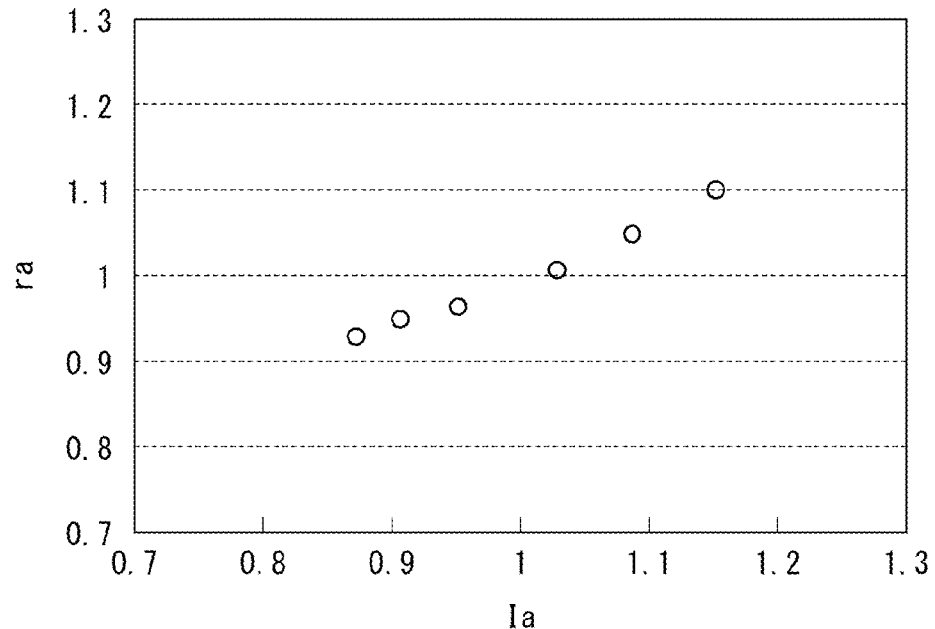
Figure 7:
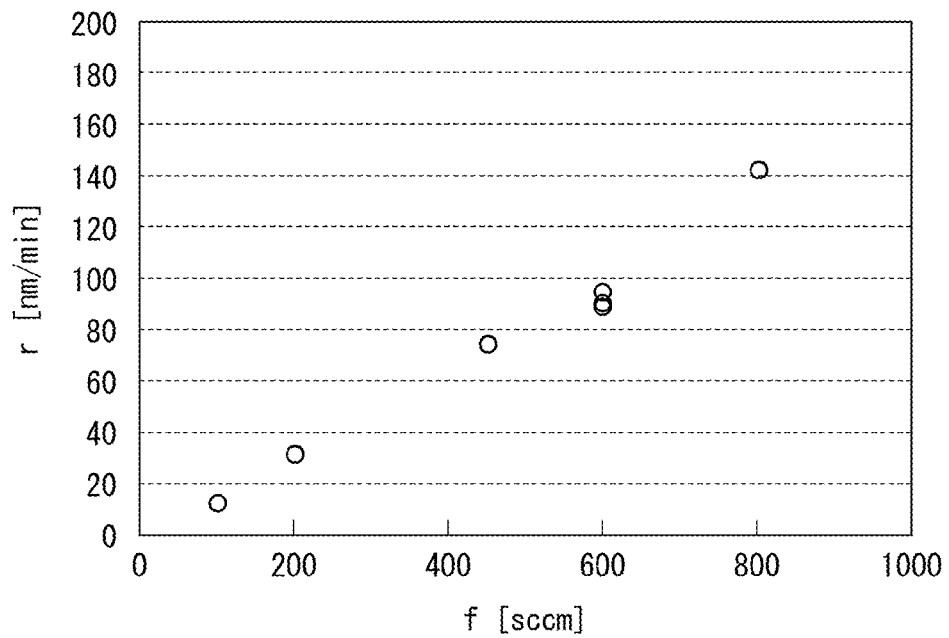

(a) of FIG. 7 is a diagram showing the relationship between a current flowing through the antenna and a film deposition rate, and (b) of FIG. 7 is a diagram showing the relationship between a flow rate of gas and a film deposition rate.

Figure 8:
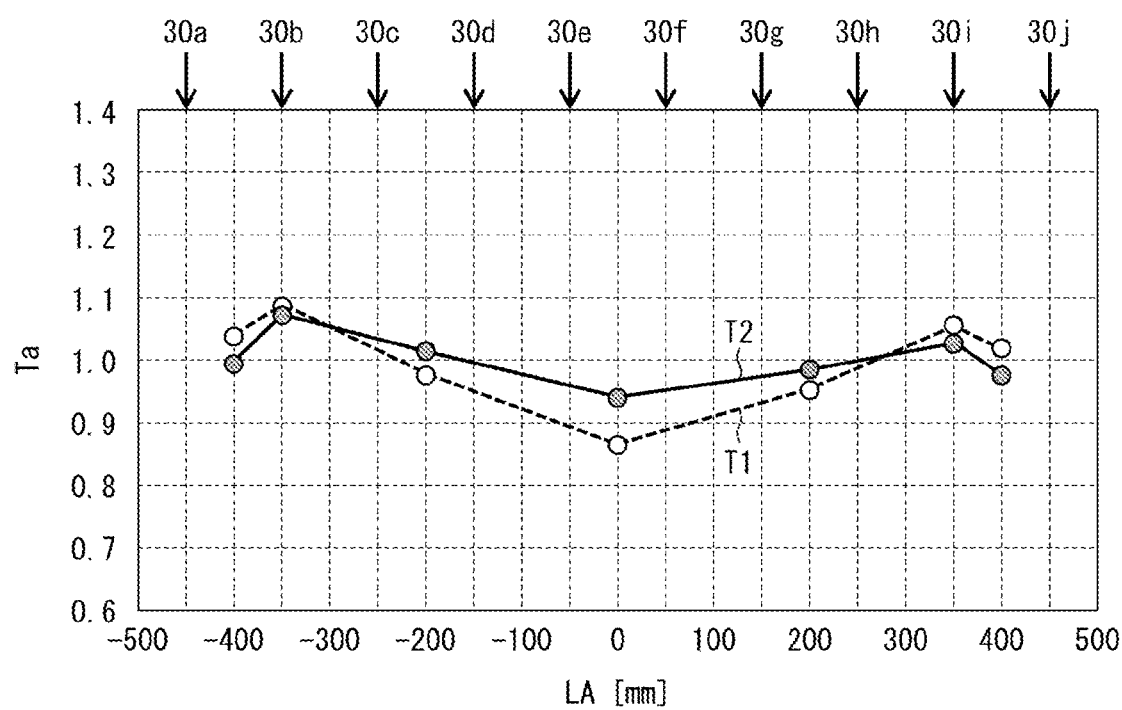

FIG. 8 is a diagram showing the relationship between a longitudinal direction of the antenna and a film thickness of a film formed on a substrate.

Figure 9:
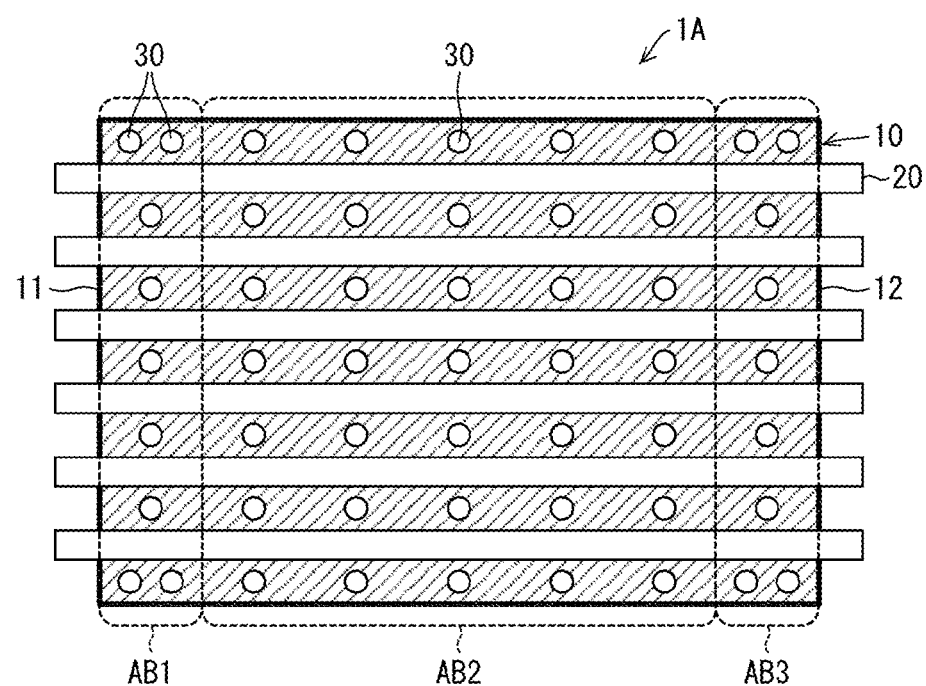
Figure 9:
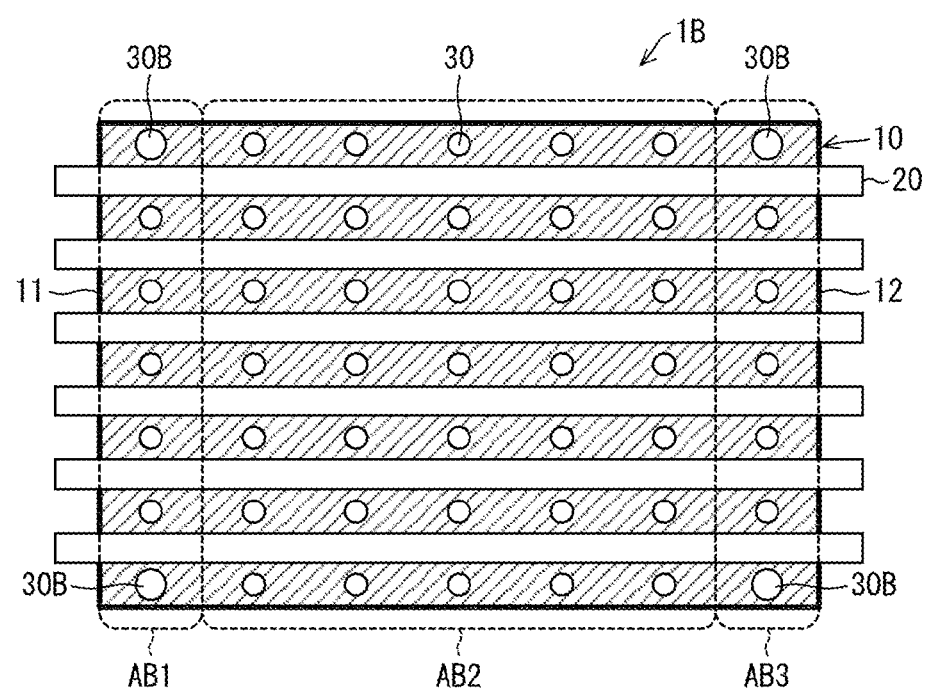

(a) of FIG. 9 is a bottom view showing the configuration of a plasma treatment device of Embodiment 2 of the present invention, and (b) of FIG. 9 is a bottom view showing the configuration of another plasma treatment device of Embodiment 2 of the present invention.

Figure 10:
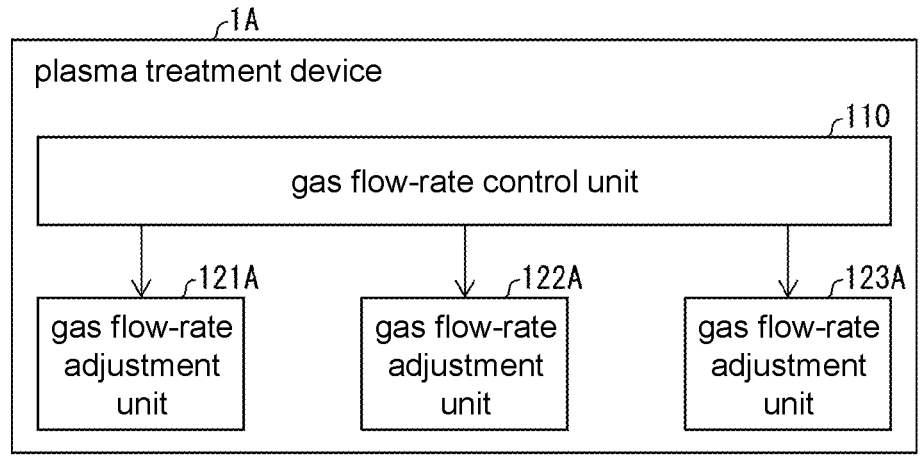
Figure 10:
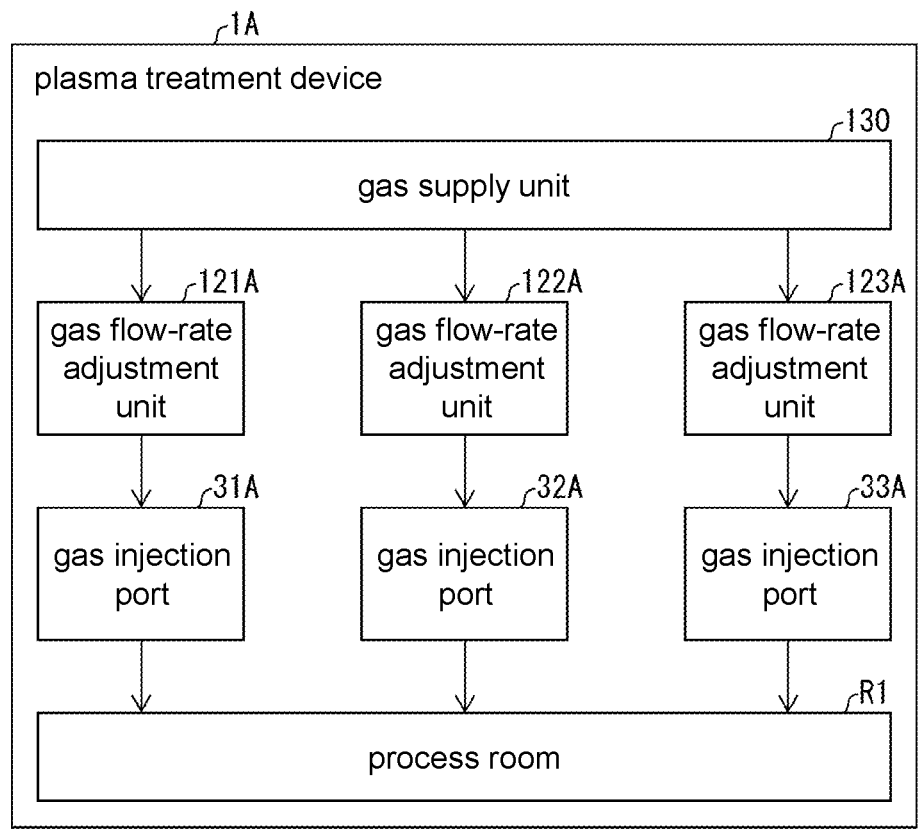

(a) of FIG. 10 is a block diagram showing the configuration of a control system of the plasma treatment device shown in (a) of FIG. 9, and (b) of FIG. 10 is a block diagram showing the configuration of a gas flow of the plasma treatment device shown in (a) of FIG. 9.

Figure 11:
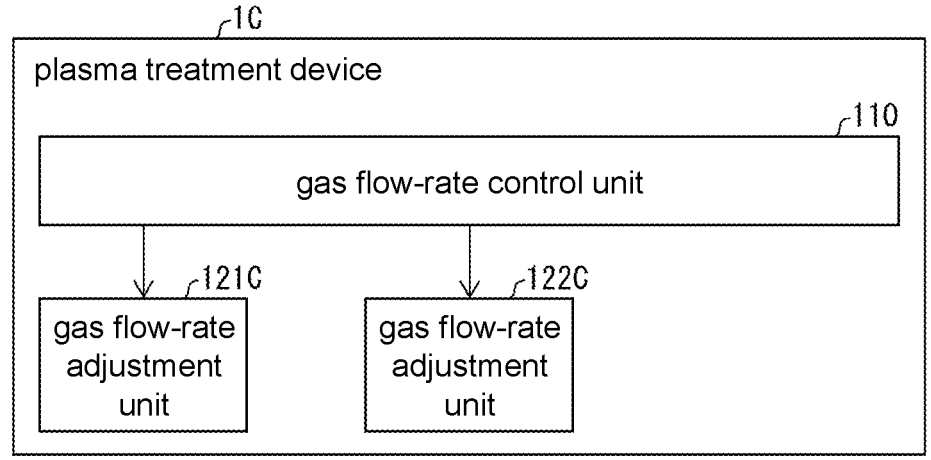
Figure 11:
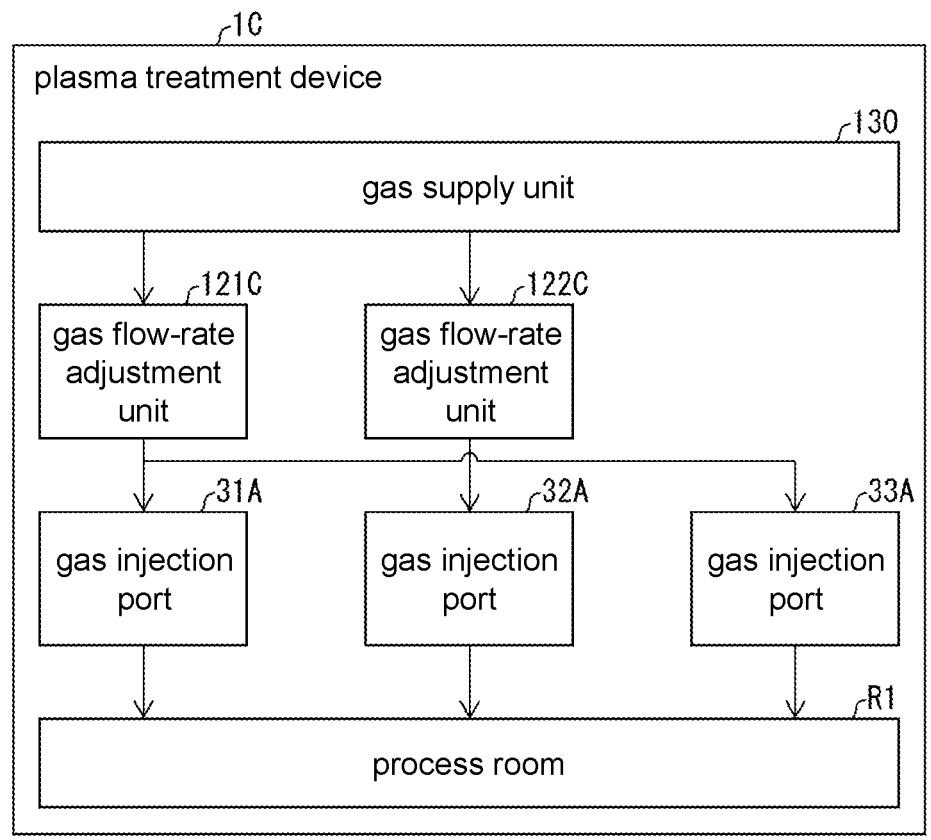

(a) of FIG. 11 is a block diagram showing the configuration of a control system of a plasma treatment device of Embodiment 3 of the present invention, and (b) of FIG. 11 is a block diagram showing the configuration of a gas flow of the plasma treatment device of Embodiment 3 of the present invention.

Figure 12:
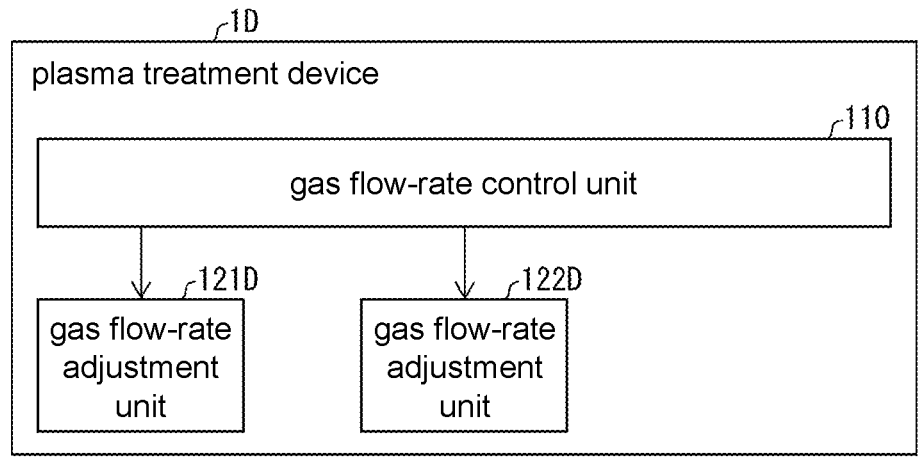
Figure 12:
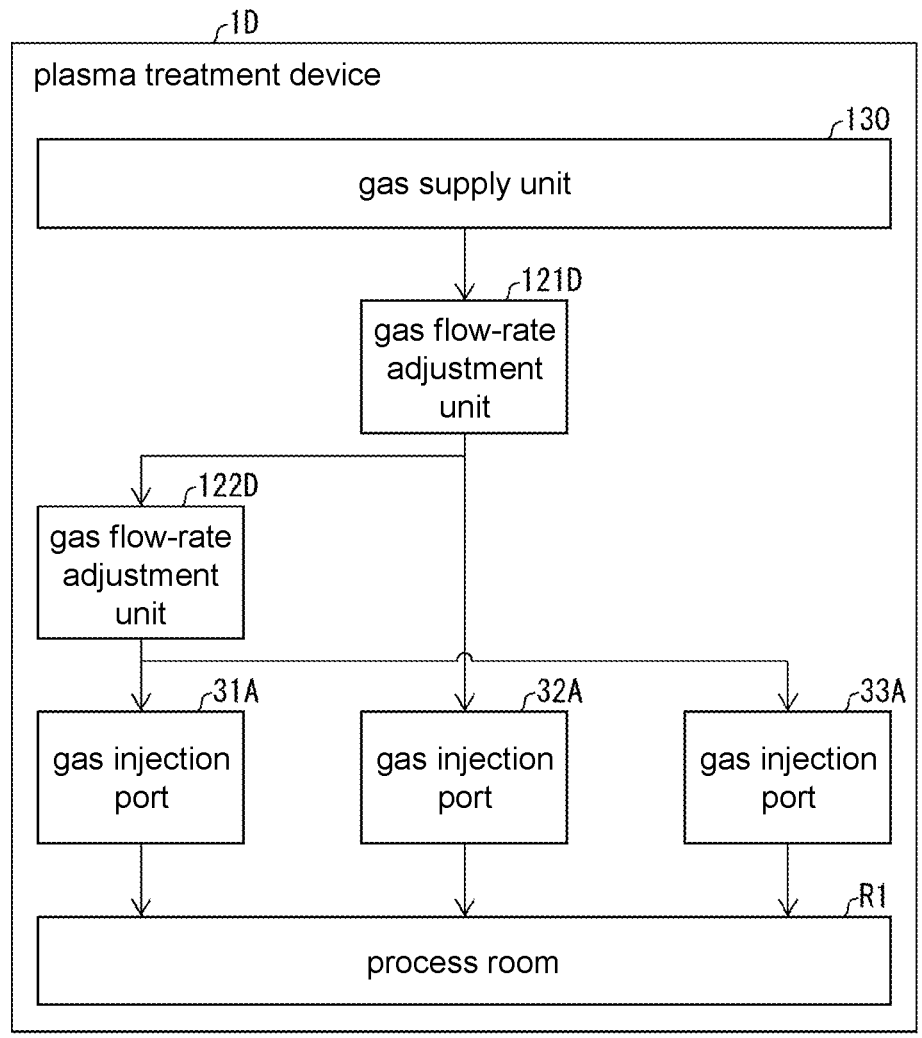

(a) of FIG. 12 is a block diagram showing the configuration of a control system of a plasma treatment device of Embodiment 4 of the present invention, and (b) of FIG. 12 is a block diagram showing the configuration of a gas flow of the plasma treatment device of Embodiment 4 of the present invention.

DESCRIPTION OF THE EMBODIMENTS

Embodiment 1

(Configuration of Plasma Treatment Device 1)

Figure 1:
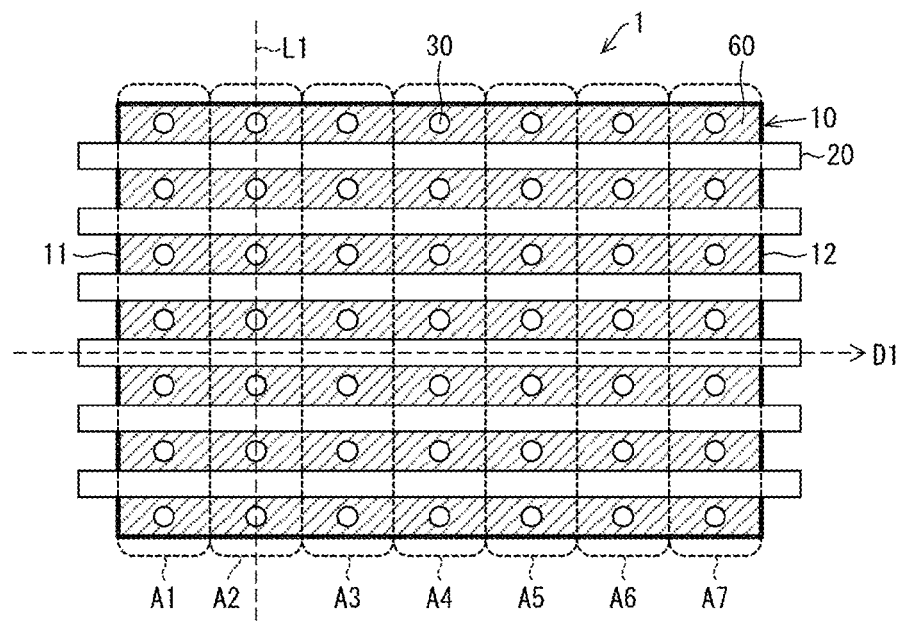
Figure 1:
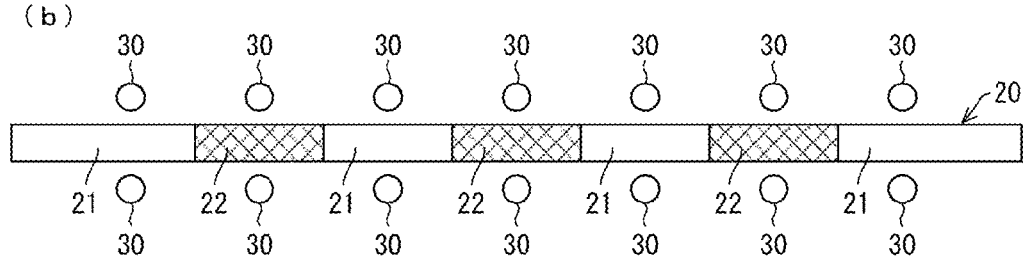

(a) of FIG. 1 is a bottom view showing the configuration of a plasma treatment device 1 of Embodiment 1 of the present invention, and (b) of FIG. 1 is a diagram showing the arrangement relationship between an antenna 20 and a gas injection port 30. In addition, (a) of FIG. 1 shows a state in which the bottom surface of a vacuum chamber 10 is excluded. Further, in (a) of FIG. 1 and (b) of FIG. 1, a substrate 40 and a substrate holder 50 which are described later are omitted.

Figure 2:
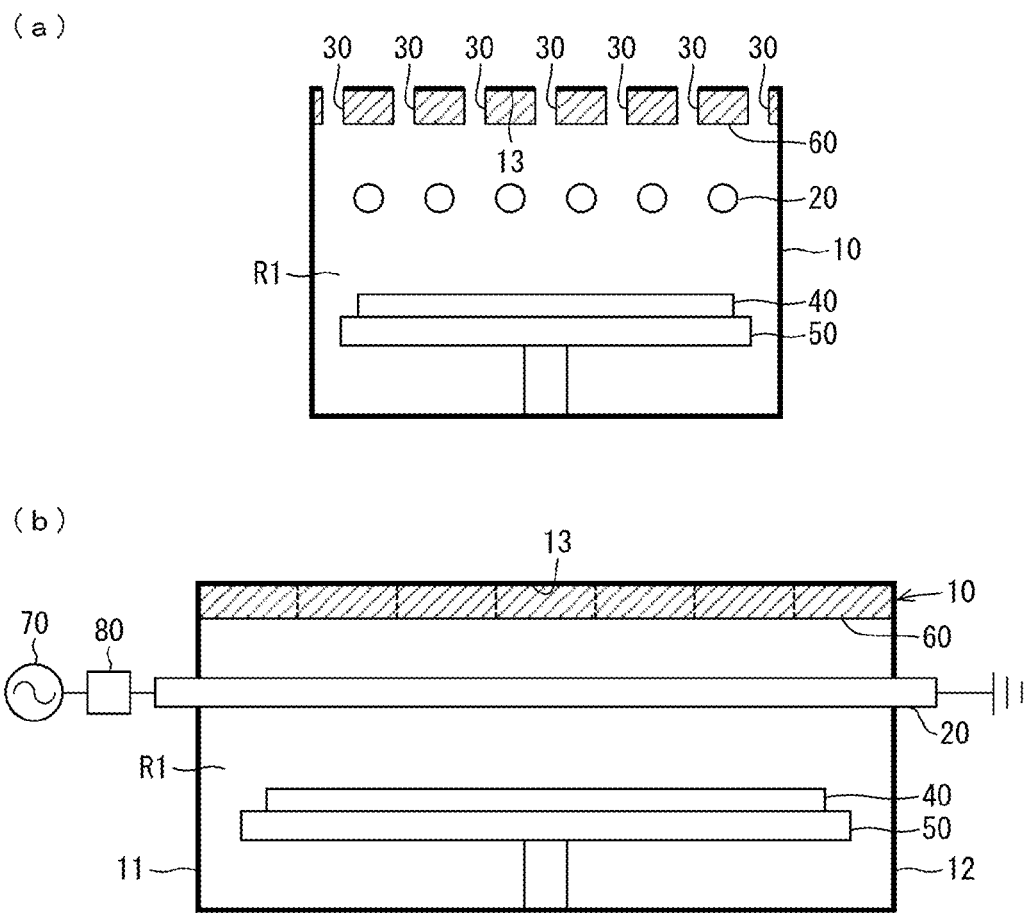

(a) of FIG. 2 is a cross-section view showing the configuration of a cross-section of the plasma treatment device 1 at a line L1 shown in (a) of FIG. 1, and (b) of FIG. 2 is a cross-section view showing the configuration of a cross-section of the plasma treatment device 1 at a line of a longitudinal direction D1 shown in (a) of FIG. 1. In addition, in the plasma treatment device 1, a side where the gas injection port 30 is arranged is referred to as an upper side, and a side where the substrate holder 50 is arranged is referred to as a lower side.

As shown in FIG. 1 and FIG. 2, the plasma treatment device 1 includes the vacuum chamber 10, a plurality of antennas 20, the substrate holder 50, plates 60, a power source 70, and a matching box 80. The plasma treatment device 1 uses inductively coupled plasma to perform a treatment to the substrate 40 arranged in the vacuum chamber 10. The plasma treatment device 1 is referred to as a plasma CVD device when performing film formation by a plasma-enhanced chemical vapor deposition (plasma CVD) method, a plasma etching device when performing etching, a plasma ashing device when performing ashing, and a plasma sputtering device when performing sputtering.

The vacuum chamber 10 is, for example, a chamber made of metal, and the inside thereof is evacuated to a vacuum by a vacuum evacuation device (not shown). The vacuum chamber 10 is electrically grounded. As shown in (a) of FIG. 2 and FIG. 2 (*b*), the antennas 20 and the substrate holder 50 are arranged in the vacuum chamber 10.

The antenna 20 is a linear antenna for plasma generation, and is arranged in a manner of facing the substrate 40 in the vacuum chamber 10 as shown in (a) of FIG. 2 and (b) of FIG. 2. Specifically, the antenna 20 is arranged above the substrate 40 in the vacuum chamber 10 along the surface of the substrate 40 (for example, substantially parallel to the surface of the substrate 40). A plurality of antennas 20 are arranged in parallel along the substrate 40 (for example, substantially parallel to the surface of the substrate 40).

In this way, it is possible to generate plasma with good uniformity in a wider range, and to handle a treatment of a larger substrate 40. (a) of FIG. 1 shows an example in which six antennas 20 are arranged, but the present invention is not limited hereto.

As shown in (a) of FIG. 1, the vicinity of both ends of the antenna 20 respectively penetrates a pair of side walls 11 and 12 facing each other in the vacuum chamber 10. Insulation members (not shown) are respectively arranged at portions that cause both ends of the antenna 20 to penetrate to the outside of the vacuum chamber 10. Both ends of the antenna 20 penetrate each of the insulation members, and the penetrating parts are vacuum-sealed by, for example, packing (not shown). The antenna 20 is supported via the insulation member in a state of being electrically insulated with respect to the side walls 11 and 12 of the vacuum chamber 10 facing each other. The space between each insulation member and the vacuum chamber 10 is also vacuum-sealed by, for example, packing (not shown).

Further, the material of each antenna 20 is, for example, copper, aluminum, an alloy of copper and aluminum, stainless steel, and the like, but is not limited hereto. In addition, the antenna 20 may be cooled by making the antenna 20 hollow and allowing a refrigerant such as cooling water to flow through the hollow antenna 20.

As shown in (a) of FIG. 1, the plurality of antennas 20 are arranged in parallel to each other in the vacuum chamber 10. Further, as shown in (b) of FIG. 1, the plurality of antennas 20 include an antenna having a structure in which a conductor unit 21 through which a current flows and a capacitance element 22 for accumulating electric charges are alternately connected in series. That is, the plurality of antennas 20 may also include an antenna that does not have the structure. In addition, the conductor unit 21 may be, for example, copper, and the capacitance element 22 is a condenser.

As shown in (a) of FIG. 1, multiple gas injection ports 30 are arranged in the vicinity of the lines L1 that are substantially perpendicular to the longitudinal directions D1 of the plurality of antennas 20 and extend in a direction in which the plurality of antennas 20 are arranged with respect to each other. Further, plural groups of the gas injection ports 30 are arranged. The group of the multiple gas injection ports 30 is a group of multiple gas injection ports 30 arranged in each of regions A1 to A7 described later.

Being substantially perpendicular to each longitudinal direction D1 of the plurality of antennas 20 refers to being substantially perpendicular to an extent that the film deposition rate and film thickness of a film formed on the substrate 40 can be made uniform. Further, the fact that the gas injection port 30 is arranged in the vicinity of the line L1 means that the gas injection port 30 is arranged in the vicinity of the line L1 to an extent that the film deposition rate and film thickness of a film formed on the substrate 40 can be made uniform.

Further, as shown in (a) of FIG. 2, the gas injection ports 30 are arranged on the upper side of the inner surface of the vacuum chamber 10. Specifically, the gas injection ports 30 are arranged on a wall 13 of the vacuum chamber 10 on a side opposite to the substrate 40 with respect to the antenna 20. The position of each gas injection port 30 may be deviated by the amount of an error caused by processing precision. The gas injected from the gas injection port 30 is, for example, $SiH_4$, but is not limited to hereto.

As shown in (b) of FIG. 1, the multiple gas injection ports 30 include gas injection ports arranged in the vicinity of the conductor units 21 and gas injection ports arranged in the vicinity of the capacitance elements 22. Thereby, because the gas injection port 30 is arranged in accordance with a regular structure of the antenna 20, when the flow rate of gas injected from each gas injection port 30 is controlled, plasma generated at each location of the substrate 40 can be more easily made uniform. Further, even when there is a difference in plasma generation in the vicinity of the conductor unit 21 and the vicinity of the capacitance element 22, plasma can be made uniform.

The fact that the gas injection ports 30 are arranged in the vicinity of the conductor units 21 and the vicinity of the capacitance elements 22 means that the gas injection ports 30 are arranged in the vicinity of the conductor units 21 and the vicinity of the capacitance elements 22 to an extent that the film deposition rate and film thickness of a film formed on the substrate 40 can be more easily made uniform.

Further, as shown in (a) of FIG. 1, the multiple gas injection ports 30 are arranged between the plurality of antennas 20 when viewed from a normal line direction with respect to a plane on which the plurality of antennas 20 are arranged. Thereby, for example, by controlling the flow rate of gas injected from each gas injection port 30, the flow rate of gas injected between the plurality of antennas 20 can be made uniform.

The substrate 40 is accommodated in the vacuum chamber 10 and arranged on the substrate holder 50. The substrate 40 is, for example, a substrate for a flat panel display (FPD) such as a liquid crystal display or an organic EL display, a flexible substrate for a flexible display, or the like. Further, the treatment performed to the substrate 40 is, for example, film formation using a plasma CVD method, etching, ashing, sputtering, or the like.

The substrate holder 50 holds the substrate 40 and is arranged in the vacuum chamber 10. The substrate holder 50 is attached to the bottom surface of the vacuum chamber 10. As shown in (b) of FIG. 2, a plurality of plates 60 are arranged on the upper side of the inner surface of the vacuum chamber 10. Specifically, the plurality of plates 60 are arranged between the antennas 20 and the wall 13 of the vacuum chamber 10 on a side opposite to the substrate 40 with respect to the antennas 20 in the vacuum chamber 10.

Each plate 60 may be a plasma generation suppressing member, and a part of the plate 60 or the whole plate 60 may be configured by a dielectric. The plate 60 is a flat plate arranged in a manner of facing each antenna 20 respectively. The plurality of plates 60 may be arranged by being spread without any gap, or may be arranged with a gap between the plates. In addition, the plate 60 may be configured by a single flat plate member.

The material of the plate 60 is preferably a material having a low dielectric constant and is, for example, a ceramic such as alumina, silicon carbide, or silicon nitride, quartz glass, non-alkali glass, other inorganic material, silicon, or the like. Thereby, the electrostatic capacity between the antenna 20 and the wall 13 of the vacuum chamber 10 becomes smaller, and a high frequency current flowing out from the antenna 20 to the wall 13 of the vacuum chamber 10 via the plate 60 becomes smaller.

As described above, it is possible to suppress the generation of plasma between the antenna 20 and the wall 13 of the vacuum chamber 10. Therefore, it is possible to suppress the flow-out of a current flowing through the antenna 20 from the antenna 20 to the wall 13 of the vacuum chamber 10 via a space between the antenna 20 and the wall 13 of the vacuum chamber 10. Thereby, because the magnitude of the current flowing through each location in the longitudinal direction D1 of the antenna 20 can be made uniform, plasma generated at each location of the substrate 40 can be made more uniform, and the film deposition rate and the film thickness of a film formed on the substrate 40 can also be made more uniform.

Further, as shown in (a) of FIG. 2, holes are formed in the wall of the vacuum chamber 10 and the plates 60, and the gas injection ports 30 are formed from the holes formed in the wall of the vacuum chamber 10 and the holes formed in the plates 60.

The power source 70 is a power source that applies a high frequency for generating inductively coupled plasma in the vacuum chamber 10 to the antenna 20 via the matching box

80. The power source 70 is electrically connected to the antenna 20 via the matching box 80. In addition, by applying a high frequency to the antenna 20 from the power source 70, a high frequency current flows through the antenna 20, an inductive electric field is generated in the vacuum chamber 10, and inductively coupled plasma is generated. (b) of FIG. 2 shows an example in which one power source 70 is arranged, but the present invention is not limited hereto.

As described above, in the plasma treatment device 1, the multiple gas injection ports 30 are arranged in the vicinity of the lines L1 that are substantially perpendicular to the longitudinal directions D1 of the plurality of antennas 20 and extend in a direction in which the plurality of antennas 20 are arranged with respect to each other.

Thereby, even if a difference is generated in the magnitude of the current flowing through each location in the longitudinal direction D1 of the antenna 20, the following effects can be obtained by performing the following treatment. Specifically, for example, by controlling the flow rate of gas injected from each gas injection port 30 so that the plasma generated at each location of the substrate 40 becomes uniform, the film deposition rate, film thickness, and film quality of a film formed on the substrate 40 can be made uniform.

In addition, the cause of generating the difference in the magnitude of the current flowing through each location in the longitudinal direction D1 of the antenna 20 may be that a current flows through the wall of the vacuum chamber 10 and the adjacent antenna 20 via the plasma.

(Electrical Connection of Plasma Treatment Device 1)

Figure 3:
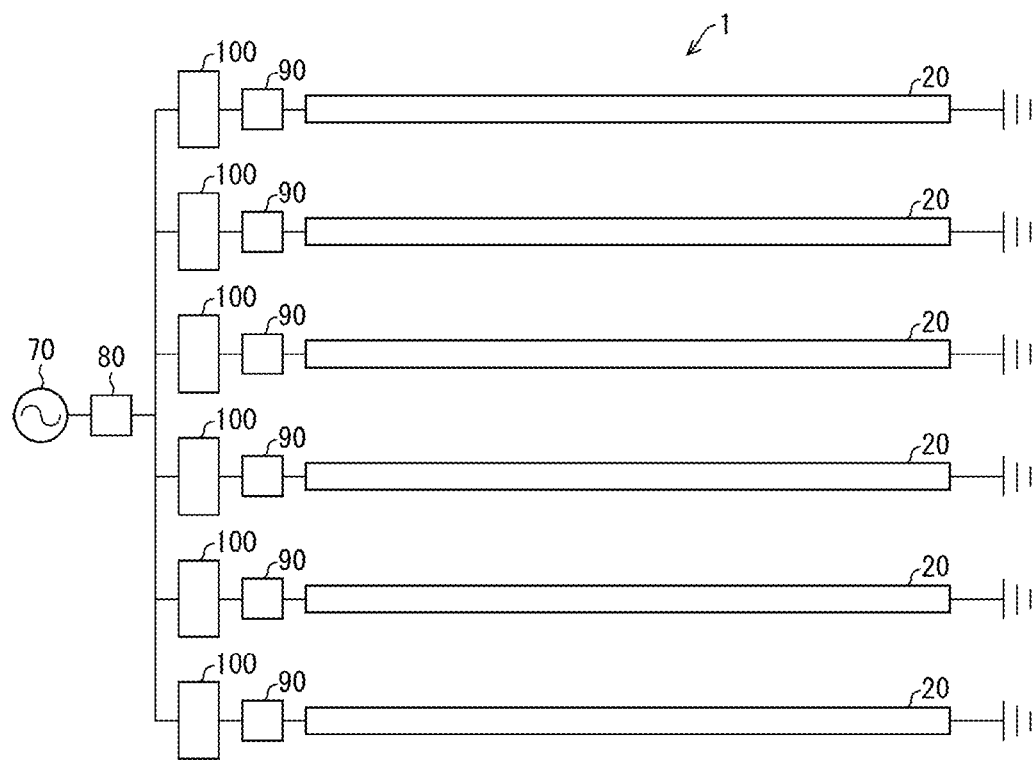
FIG. 3 is a diagram showing an electrical connection of the plasma treatment device shown in (a) of FIG. 1.

FIG. 3 is a diagram showing an electrical connection of the plasma treatment device 1. In addition, in FIG. 3, the vacuum chamber 10, the gas injection port 30, the substrate 40, the substrate holder 50, and the plate 60 are omitted. As shown in FIG. 3, the plasma treatment device 1 further includes six current detection units 90 and six impedance control units 100. The current detection unit 90 is, for example, a resistor, and is used for detecting a current flowing through the antenna 20. The impedance control unit 100 is a circuit or an element that controls impedance.

As shown in FIG. 3, the power source 70 is electrically connected to the matching box 80, and the matching box 80 is electrically connected to the six impedance control units 100. The six impedance control units 100 are electrically connected to the six current detection units 90 respectively. That is, the six impedance control units 100 and the six current detection units 90 correspond one to one. The six current detection units 90 are electrically connected to six antennas 20 respectively. That is, the six current detection units 90 and the six antennas 20 correspond one to one.

In addition, FIG. 3 shows an example in which the six current detection units 90 and the six impedance control units 100 are arranged, but the present invention is not limited hereto. A side of the antenna 20 opposite to the side connected to the current detection unit 90 is connected to ground.

(Electrical Connection of Plasma Treatment Device 1*a*)

Figure 4:
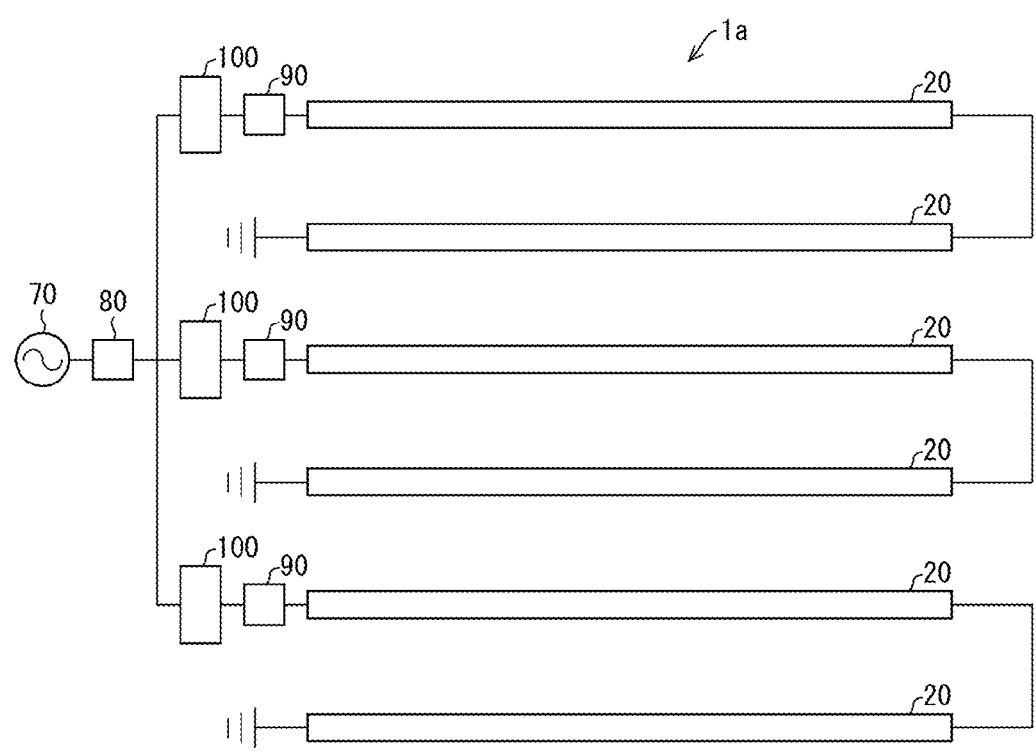
FIG. 4 is a diagram showing an electrical connection of a plasma treatment device different from the plasma treatment device shown in FIG. 3.

FIG. 4 is a diagram showing an electrical connection of a plasma treatment device 1*a* different from the plasma treatment device 1 shown in FIG. 3. As shown in FIG. 4, the plasma treatment device 1*a* is different from the plasma treatment device 1 in terms that adjacent antennas 20 are connected to each other via an electrical wiring. Specifically, one end of one antenna 20 of two adjacent antennas 20 is electrically connected to the current detection unit 90, and the other end of the antenna 20 is electrically connected to one end of the other antenna 20 of the two adjacent antennas 20. That is, two adjacent antennas 20 are connected in series.

By connecting two adjacent antennas 20 in series, the number of the current detection unit 90 and the impedance control unit 100 can be halved. That is, the number of the current detection unit 90 and the number of the impedance control unit 100 respectively become three. Thereby, the manufacturing cost of the plasma treatment device 1*a* can be reduced.

(Configuration of Control System of Plasma Treatment Device 1)

Figure 5:
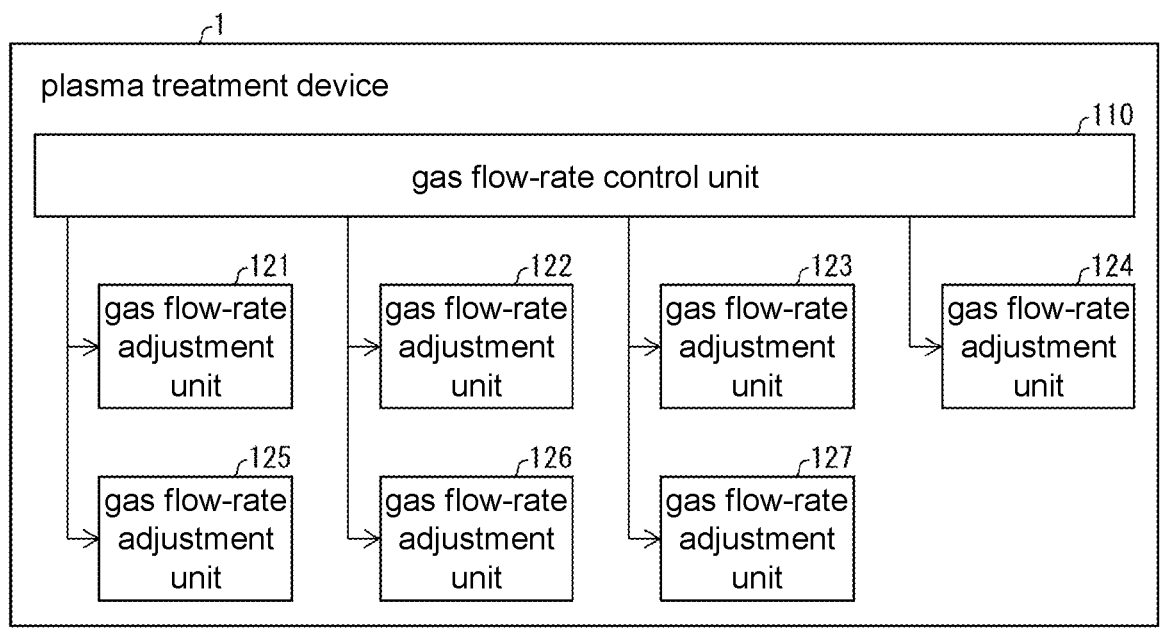
FIG. 5 is a block diagram showing the configuration of a control system of the plasma treatment device shown in (a) of FIG. 1.

FIG. 5 is a block diagram showing the configuration of a control system of the plasma treatment device 1. In addition, in FIG. 5, the vacuum chamber 10, the antenna 20, the gas injection port 30, the substrate 40, the substrate holder 50, the plate 60, the power source 70, the matching box 80, the current detection unit 90, and the impedance control unit 100 are omitted. As shown in FIG. 5, the plasma treatment device 1 further includes a gas flow-rate control unit 110 and gas flow-rate adjustment units 121 to 127.

The gas flow-rate control unit 110 adjusts the flow rate of gas passing through the gas flow-rate adjustment units 121 to 127 by controlling the gas flow-rate adjustment units 121 to 127. Specifically, the gas flow-rate control unit 110 determines the flow rate of gas for each gas flow-rate adjustment unit, and transmits a signal showing the flow rate of gas to the gas flow-rate adjustment units 121 to 127.

The gas flow-rate adjustment units 121 to 127 have a mechanism for adjusting the flow rate of gas passing through the gas flow-rate adjustment units 121 to 127. Specifically, the gas flow-rate adjustment units 121 to 127 may be respectively, for example, a mass flow controller, a needle valve, or the like. Based on the signal received from the gas flow-rate control unit 110, the gas flow-rate adjustment units 121 to 127 respectively adjust the flow rates of gas injected from multiple gas injection ports 30 included in each of the regions A1 to A7.

For example, the gas flow-rate adjustment unit 121 adjusts the flow rate of gas injected from multiple gas injection ports 30 included in the region A1. That is, one gas flow-rate adjustment unit collectively adjusts the flow rate of gas injected from gas injection ports 30 having positions equal to each other in the longitudinal direction D1 of the antenna 20.

Thereby, because the number of the gas flow-rate adjustment unit controlled by the gas flow-rate control unit 110 can be reduced, the number of control parameters of the gas flow-rate control unit 110 can be reduced, and the control of the gas flow-rate control unit 110 can be simplified. Further, because the number of the gas flow-rate adjustment unit is reduced, the manufacturing cost of the plasma treatment device 1 can be reduced.

Further, the gas flow-rate adjustment units 121 to 127 are respectively connected to multiple gas injection ports 30 included in each of the regions A1 to A7 by flow paths of gas. For example, the gas flow-rate adjustment unit 121 is connected to multiple gas injection ports 30 included in the region A1 by the flow path of gas.

In addition, in each region of the regions A1 to A7, multiple gas injection ports 30 may inject the same amount of gas, or may inject different amounts of gas. When multiple gas injection ports 30 included in the region A1 inject different amounts of gas, for example, the amount of gas injected from gas injection ports 30 in the vicinity of a corner part of the vacuum chamber 10 may be larger than the amount of gas injected from gas injection ports 30 at other locations. That is, the amount of gas injected from upper and lower gas injection ports 30 in a direction perpendicular to the longitudinal direction D1 may be larger than the amount of gas injected from gas injection ports 30 at other locations.

As described above, the gas flow-rate control unit 110 controls the flow rate of gas injected from each group of the multiple gas injection ports 30. Thereby, for example, the gas flow-rate control unit 110 controls the flow rate of gas injected from each gas injection port 30 so that plasma generated at each location of the substrate 40 becomes uniform, and thereby the film deposition rate, film thickness, and film quality of a film formed on the substrate 40 can be made uniform.

(Gas Flow of Plasma Treatment Device 1)

Figure 6:
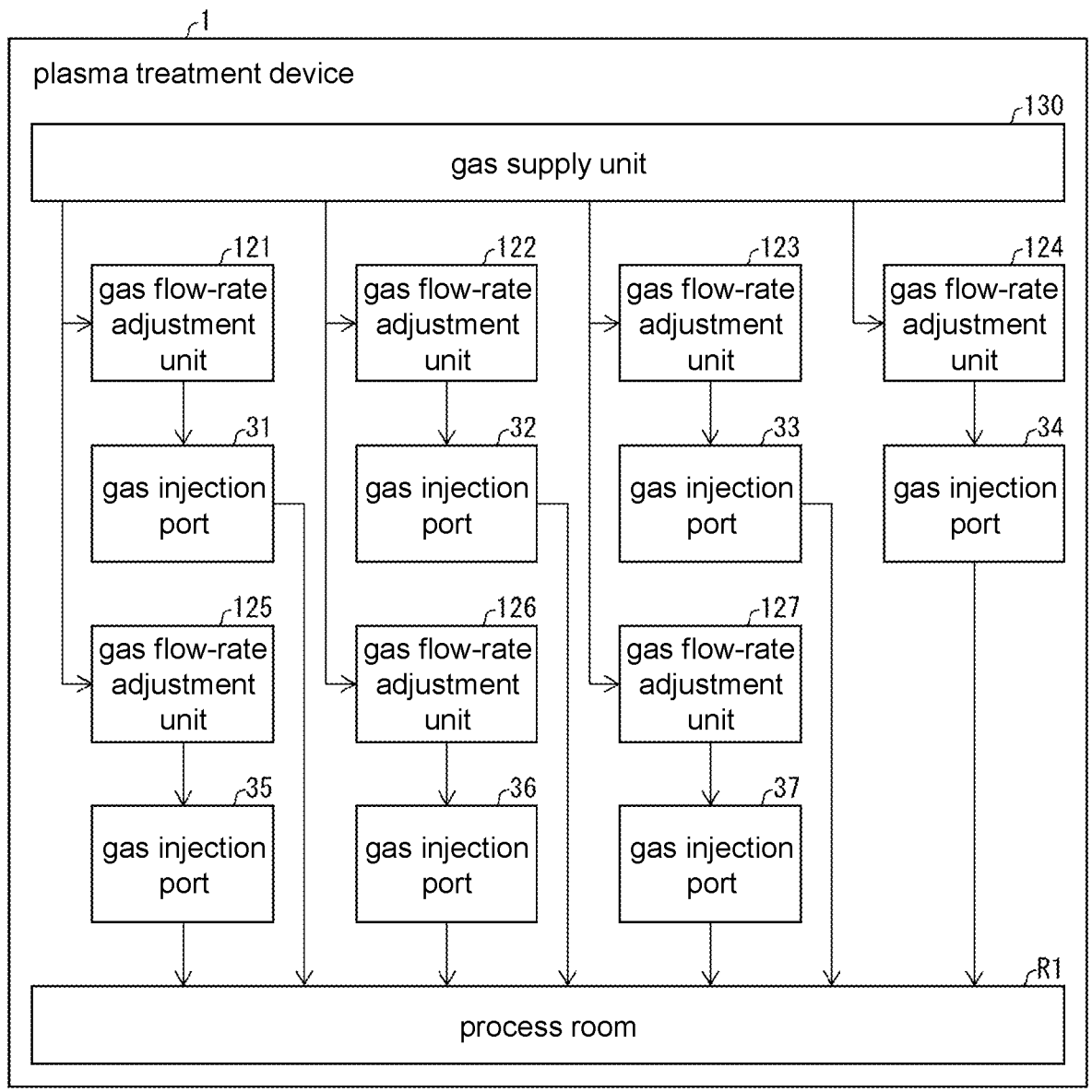
FIG. 6 is a block diagram showing the configuration of a gas flow of the plasma treatment device shown in (a) of FIG. 1.

FIG. 6 is a block diagram showing the configuration of a gas flow of the plasma treatment device 1. In addition, in FIG. 6, a part of the configuration is omitted as in FIG. 5. As shown in FIG. 6, the plasma treatment device 1 further includes a gas supply unit 130 and gas injection ports 31 to 37.

The gas injection ports 31 to 37 respectively show all the gas injection ports 30 included in the regions A1 to A7 shown in (a) of FIG. 1. For example, the gas injection port 31 shows all the gas injection ports 30 included in the region A1.

The gas supply unit 130 is, for example, a gas cylinder, is connected to the gas flow-rate adjustment units 121 to 127 by flow paths of gas, and supplies gas to the gas flow-rate adjustment units 121 to 127. The gas flow-rate adjustment units 121 to 127 are respectively arranged in flow paths of gas between the gas supply unit 130 and the gas injection ports 31 to 37. The gas injection ports 31 to 37 are respectively connected to a process room R1. The process room R1 is a space inside the vacuum chamber 10 and is a space in which a film deposition treatment of the substrate 40 is performed.

(Relationship Between Current Flowing Through Antenna 20 and Film Deposition Rate)

(a) of FIG. 7 is a diagram showing the relationship between a current flowing through the antenna 20 and a film deposition rate. In (a) of FIG. 7, the horizontal axis represents a value Ia standardized by an average value of six points in the current flowing through the antenna 20, and the vertical axis represents a value ra standardized by an average value of six points in the film deposition rate.

As shown in (a) of FIG. 7, the larger the current flowing through the antenna 20 is, the larger the film deposition rate is. That is, there is a correlation between the current flowing through the antenna 20 and the film deposition rate. Thereby, when there is a difference in the magnitude of the current flowing through each location in the longitudinal direction D1 of the antenna 20, the film deposition rate at each location of the substrate 40 may be non-uniform.

(Relationship Between Flow Rate of Gas and Film Deposition Rate)

(b) of FIG. 7 is a diagram showing the relationship between a flow rate of gas and a film deposition rate. In (b) of FIG. 7, the horizontal axis represents a flow rate of gas f (sccm), and the vertical axis represents a film deposition rate r (nm/min).

As shown in (b) of FIG. 7, the larger the flow rate of gas f is, the larger the film deposition rate r is. Thereby, when there is a difference in the magnitude of the current flowing through each location in the longitudinal direction D1 of the antenna 20, if the flow rate of gas f is increased at a location where the film deposition rate of the substrate 40 is small by the control of the gas flow-rate control unit 110, the film deposition rate at each location of the substrate 40 can be made uniform.

(Relationship Between Longitudinal Direction of Antenna 20 and Film Thickness)

FIG. 8 is a diagram showing the relationship between a longitudinal direction of the antenna 20 and a film thickness of the film formed on the substrate 40. In FIG. 8, the horizontal axis represents a position LA (mm) in the longitudinal direction D1 of the antenna 20, and the vertical axis represents a value Ta standardized by an average value of seven points in the film thickness of the film formed on the substrate 40.

Further, arrows at the top of FIG. 8 show positions of gas injection ports 30a to 30j. The gas injection ports 30a and 30j are located in the vicinity of both ends of the antenna 20 (the vicinity of the side walls 11 and 12 of the vacuum chamber 10), and the gas injection ports 30b to 30i are located in the vicinity of a central part of the antenna 20.

In FIG. 8, a line T1 shows a result when the set flow rate of gas of the gas injection ports 30a and 30j is set to 3.2 times the set flow rate of gas of the gas injection ports 30b to 30i. A line T2 shows a result when the set flow rate of gas of the gas injection ports 30a and 30j is set to 2.2 times the set flow rate of gas of the gas injection ports 30b to 30i. The set flow rate of gas is a set value of the flow rate of gas injected from each of the gas injection ports 30a to 30j set by the gas flow-rate control unit 110.

In the case of the line T1, the uniformity of the film thickness of a film obtained by a MAX-MIN method is 11.4%, and in the case of the line T2, the uniformity of the film thickness of a film by the MAX-MIN method is 6.4%. Therefore, in the case of the line T2, the uniformity of the film thickness of a film is improved as compared with the case of the line T1. Thereby, by determining the set value of the flow rate of gas injected from each gas injection port by the gas flow-rate control unit 110, the film thickness of a film formed on the substrate 40 can be made more uniform.

Embodiment 2

(a) of FIG. 9 is a bottom view showing the configuration of a plasma treatment device 1A of Embodiment 2 of the present invention, and (b) of FIG. 9 is a bottom view showing the configuration of another plasma treatment device 1B of Embodiment 2 of the present invention. In addition, for convenience of description, the same reference numerals are added to members having the same functions as the members described in the above embodiment, and the description thereof is not repeated. Further, (a) of FIG. 9 and (b) of FIG. 9 show a state in which the bottom surface of the vacuum chamber 10 is excluded.

As shown in (a) of FIG. 9, the plasma treatment device 1A has a different structure of the gas injection ports 30 in the vicinity of corner parts of the vacuum chamber 10 as compared with the plasma treatment device 1. Specifically, in the plasma treatment device 1A, the number of the gas injection port 30 arranged in the vicinity of the corner part of the vacuum chamber 10 is more than the number of the gas injection port 30 arranged at a location other than the vicinity of the corner part. In (a) of FIG. 9, the number of the gas injection port 30 arranged in the vicinity of the corner part of the vacuum chamber 10 is two, and the number of the gas injection port 30 arranged at a location other than the vicinity of the corner part is one.

Further, as shown in (b) of FIG. 9, the plasma treatment device 1B also has a different structure of the gas injection ports 30 in the vicinity of corner parts of the vacuum chamber 10 as compared with the plasma treatment device 1. Specifically, in the plasma treatment device 1B, the size of the diameter of a gas injection port 30B arranged in the vicinity of the corner part of the vacuum chamber 10 is larger than the size of the diameter of the gas injection port 30 arranged at a location other than the vicinity of the corner part.

In this way, in the plasma treatment devices 1A and 1B, the gas injection ports 30 are arranged as follows. Specifically, the gas injection port 30 arranged in the vicinity of the corner part of the vacuum chamber 10 is arranged in a manner that the flow rate of the gas injected from the gas injection port 30 arranged in the vicinity of the corner part is larger than the flow rate of the gas injected from the gas injection port 30 arranged at a location other than the vicinity of the corner part.

Therefore, it is possible to increase the flow rate of gas in the vicinity of the corner part of the vacuum chamber 10, where the flow rate of gas tends to be smaller than at other locations. Thereby, plasma generated at each location of the substrate 40 can be made more uniform, and the film deposition rate, film thickness and film quality of a film formed on the substrate 40 can also be made more uniform.

In addition, the fact that the gas injection port 30 is arranged in the vicinity of the corner part of the vacuum chamber 10 means that the gas injection port 30 is arranged in the vicinity of the corner part of the vacuum chamber 10 to an extent that the film deposition rate and the film thickness of a film formed on the substrate 40 can also be made more uniform.

(Configuration of Control System of Plasma Treatment Device 1A)

(a) of FIG. 10 is a block diagram showing the configuration of a control system of the plasma treatment device 1A. In addition, in (a) of FIG. 10, a part of the configuration is omitted as in FIG. 5. As shown in (a) of FIG. 10, the plasma treatment device 1A further includes the gas flow-rate control unit 110 and gas flow-rate adjustment units 121A to 123A.

The gas flow-rate control unit 110 adjusts the flow rate of gas passing through the gas flow-rate adjustment units 121A to 123A by controlling the gas flow-rate adjustment units 121A to 123A. The gas flow-rate adjustment units 121A to 123A have the same structure and function as the gas flow-rate adjustment units 121 to 127.

The gas flow-rate adjustment units 121A to 123A respectively adjust the flow rate of gas injected from multiple gas injection ports 30 included in each of regions AB1 to AB3 shown in (a) of FIG. 9. For example, the gas flow-rate adjustment unit 121A adjusts the flow rate of gas injected from multiple gas injection ports 30 included in the region AB1. In addition, the plasma treatment device 1B shown in (b) of FIG. 9 may also have the same configuration of the control system as the plasma treatment device 1A.

(Gas Flow of Plasma Treatment Device 1A)

(b) of FIG. 10 is a block diagram showing the configuration of a gas flow of the plasma treatment device 1A. In addition, in (b) of FIG. 10, a part of the configuration is omitted as in FIG. 5. As shown in (b) of FIG. 10, the plasma treatment device 1A further includes the gas supply unit 130 and gas injection ports 31A to 33A.

The gas injection ports 31A to 33A respectively show all the gas injection ports 30 included in the regions AB1 to AB3 shown in (a) of FIG. 9. For example, the gas injection port 31A shows all the gas injection ports 30 included in the region AB1.

The gas supply unit 130 is connected to the gas flow-rate adjustment units 121A to 123A by flow paths of gas, and supplies gas to the gas flow-rate adjustment units 121A to 123A.

The gas flow-rate adjustment units 121A to 123A are respectively arranged in flow paths of gas between the gas supply unit 130 and the gas injection ports 31A to 33A. In addition, the plasma treatment device 1B shown in (b) of FIG. 9 may also have the same configuration of the gas flow as the plasma treatment device 1A.

In this way, in the plasma treatment device 1A, the sizes of the regions AB1 to AB3 may not be the same as each other, and the gas injection ports 30 arranged in the vicinity of the side walls 11 and 12 of the vacuum chamber 10 where the flow rate of gas tends to decrease may be controlled in a region smaller than other locations. That is, in the plasma treatment device 1A, the sizes of the regions AB1 and AB3 may be smaller than the size of the region AB2. Thereby, because the number of the gas flow-rate adjustment unit controlled by the gas flow-rate control unit 110 can be further reduced, the number of control parameters of the gas flow-rate control unit 110 can be further reduced, and the control of the gas flow-rate control unit 110 can be further simplified. Further, because the number of the gas flow-rate adjustment unit is further reduced, the manufacturing cost of the plasma treatment device 1 can be further reduced.

Embodiment 3

(a) of FIG. 11 is a block diagram showing the configuration of a control system of a plasma treatment device 1C of Embodiment 3 of the present invention, and (b) of FIG. 11 is a block diagram showing the configuration of a gas flow of the plasma treatment device 1C of Embodiment 3 of the present invention. In addition, for convenience of description, the same reference numerals are added to members having the same functions as the members described in the above embodiments, and the description thereof is not repeated.

(Configuration of Control System of Plasma Treatment Device 1C)

In (a) of FIG. 11, a part of the configuration is omitted as in FIG. 5. As shown in (a) of FIG. 11, the plasma treatment device 1C further includes the gas flow-rate control unit 110 and gas flow-rate adjustment units 121C, 122C. The structure of the plasma treatment device 1C may be the same as that of the plasma treatment device 1A within a range shown in (a) of FIG. 9.

The gas flow-rate control unit 110 adjusts the flow rate of gas passing through the gas flow-rate adjustment units 121C, 122C by controlling the gas flow-rate adjustment units 121C, 122C. The gas flow-rate adjustment units 121C, 122C have the same structure and function as the gas flow-rate adjustment units 121 to 127.

The gas flow-rate adjustment unit 121C adjusts the flow rate of gas injected from multiple gas injection ports 30 included in the regions AB1 and AB3 shown in (a) of FIG. 9. The gas flow-rate adjustment unit 122C adjusts the flow rate of gas injected from multiple gas injection ports 30 included in the region AB2 shown in (a) of FIG. 9.

(Gas Flow of Plasma Treatment Device 1C)

In (b) of FIG. 11, a part of the configuration is omitted as in FIG. 5. As shown in (b) of FIG. 11, the plasma treatment device 1C further includes the gas supply unit 130 and the gas injection ports 31A to 33A.

The gas supply unit 130 is connected to the gas flow-rate adjustment units 121C, 122C by flow paths of gas, and supplies gas to the gas flow-rate adjustment units 121C, 122C. The gas flow-rate adjustment unit 121C is arranged in flow paths of gas between the gas supply unit 130 and the gas injection ports 31A and 33A. The gas flow-rate adjustment unit 122C is arranged in flow paths of gas between the gas supply unit 130 and the gas injection port 32A.

In this way, by one gas flow-rate adjustment unit 121C, the plasma treatment device 1C may adjust the flow rate of gas injected from the gas injection ports 31A and 33A arranged in the vicinity of the side walls 11 and 12 on both sides of the vacuum chamber 10 where the flow rate of gas tends to decrease. Thereby, compared with the plasma treatment device 1A, because the number of the gas flow-rate adjustment unit controlled by the gas flow-rate control unit 110 can be further reduced, the control of the gas flow-rate control unit 110 can be further simplified, and the manufacturing cost of the plasma treatment device 1C can be further reduced.

Embodiment 4

(a) of FIG. 12 is a block diagram showing the configuration of a control system of a plasma treatment device 1D of Embodiment 4 of the present invention, and (b) of FIG. 12 is a block diagram showing the configuration of a gas flow of the plasma treatment device 1D of Embodiment 4 of the present invention. In addition, for convenience of description, the same reference numerals are added to members having the same functions as the members described in the above embodiments, and the description thereof is not repeated.
(Configuration of Control System of Plasma Treatment Device 1D)

In (a) of FIG. 12, a part of the configuration is omitted as in FIG. 5. As shown in (a) of FIG. 12, the plasma treatment device 1D further includes the gas flow-rate control unit 110 and gas flow-rate adjustment units 121D, 122D. The structure of the plasma treatment device 1D may be the same as that of the plasma treatment device 1A within a range shown in (a) of FIG. 9.

The gas flow-rate control unit 110 adjusts the flow rate of gas passing through the gas flow-rate adjustment units 121D, 122D by controlling the gas flow-rate adjustment units 121D, 122D. The gas flow-rate adjustment units 121D, 122D have the same structure and function as the gas flow-rate adjustment units 121 to 127.

The gas flow-rate adjustment unit 121D adjusts the flow rate of gas injected from multiple gas injection ports 30 included in the regions AB1 and AB3 shown in (a) of FIG. 9.

The gas flow-rate adjustment unit 122D adjusts the flow rate of gas injected from multiple gas injection ports 30 included in the region AB2 shown in (a) of FIG. 9.
(Gas Flow of Plasma Treatment Device 1D)

In (b) of FIG. 12, a part of the configuration is omitted as in FIG. 5. As shown in (b) of FIG. 12, the plasma treatment device 1D further includes the gas supply unit 130 and the gas injection ports 31A to 33A.

The gas supply unit 130 is connected to the gas flow-rate adjustment unit 121D by a flow path of gas, and supplies gas to the gas flow-rate adjustment unit 121D. The gas flow-rate adjustment unit 122D is arranged in flow paths of gas between the gas flow-rate adjustment unit 121D and the gas injection ports 31A, 33A. Further, the gas flow-rate adjustment unit 121D is arranged in flow paths of gas between the gas supply unit 130 and the gas flow-rate adjustment unit 122D and the gas injection port 32A.

In this way, the plasma treatment device 1D may adjust the total flow rate of gas injected from the gas injection ports 31A to 33A by the gas flow-rate adjustment unit 121D, and adjust the ratio of the flow rate of gas injected from the gas injection ports 31A to 33A with respect to the total flow rate of gas by the gas flow-rate adjustment unit 122D. Thereby, even when there are many types of gas introduced into the vacuum chamber 10, the total flow rate of gas introduced into the vacuum chamber 10 can be easily grasped, and setting errors or the like of the control parameters of the gas flow-rate control unit 110 can be reduced.
[Implementation Examples Using Software]

Control blocks of the plasma treatment devices 1, 1A to 1D (particularly, the gas flow-rate control unit 110) may be realized by a logic circuit (hardware) formed in an integrated circuit (IC chip) or the like, or may be realized by software.

In the latter case, the plasma treatment devices 1, 1A to 1D include a computer that executes instructions of a program which is software for realizing each function. The computer includes, for example, one or more processors and a recording medium which has stored the program and is computer-readable. Besides, the processor reads the program from the recording medium and executes the program in the computer, and thereby the objective of the present invention is achieved. As the processor, for example, a central processing unit (CPU) can be used. As the recording medium, a "non-temporary tangible medium" such as a read only memory (ROM) or the like, a tape, a disk, a card, a semiconductor memory, a programmable logic circuit, or the like can be used. Further, a random access memory (RAM) or the like for developing the program may be further included. Further, the program may be supplied to the computer via an arbitrary transmission medium (communication network, broadcast wave, or the like) capable of transmitting the program. In addition, one aspect of the present invention can also be realized in the form of a data signal which is embedded in a carrier wave and in which the program is embodied by electronic transmission.

The present invention is not limited to the above-described embodiments, various modifications can be made within the scope of claims, and embodiments obtained by appropriately combining technical means respectively disclosed in the different embodiments are also included in the technical scope of the present invention.

What is claimed is:

1. A plasma treatment device, comprising:
a plurality of antennas for plasma generation arranged in a manner of facing a substrate in a vacuum chamber in which the substrate is accommodated; and
a plurality of groups of multiple gas injection ports arranged in the vicinity of lines that are substantially perpendicular to longitudinal directions of the plurality of antennas and extend in a direction in which the plurality of antennas are arranged with respect to each other;
the plasma treatment device further comprising
a gas flow-rate control unit for controlling flow rates of gas injected from each of the groups of the multiple gas injection ports, wherein the flow rates of gas injected from each of the multiple gas injection ports in each of the groups is controlled respectively,
wherein a number of the gas injection ports arranged in the vicinity of a corner part of the vacuum chamber is more than a number of the gas injection ports arranged at a location other than the vicinity of the corner part, or a size of a diameter of the gas injection ports arranged in the vicinity of the corner part of the vacuum chamber is larger than a size of a diameter of the gas injection ports arranged at the location other than the vicinity of the corner parts the plurality of antennas includes an antenna having a regular structure in which a conductor unit through which a current flows and a capacitor for accumulating electric charges are alternately connected in series, wherein the gas injection ports are disposed in a matrix of rows and columns, the antennas disposed parallel to and alternating to rows of injection ports such that each alternate conductor element or capacitor element is aligned with a gas injection port and is in parallel to the column of injection ports.

2. The plasma treatment device according to claim 1, wherein the multiple gas injection ports are arranged between the plurality of antennas when viewed from a normal line direction with respect to a plane on which the plurality of antennas are arranged.

3. The plasma treatment device according to claim 1, wherein in the vacuum chamber, a plasma generation suppressing member comprising a plurality of plates or a single flat plate member is arranged between the antenna and a wall of the vacuum chamber opposite to the substrate with respect to the antenna.

* * * * *